(12) United States Patent
Rokubuichi et al.

(10) Patent No.: US 11,322,430 B2
(45) Date of Patent: May 3, 2022

(54) SEMICONDUCTOR DEVICE AND SEMICONDUCTOR MODULE WITH A HIGHEST PORTION OF A TERMINAL LOWER THAN A HIGHEST PORTION OF THE MOLD SEALING RESIN

(71) Applicant: Mitsubishi Electric Corporation, Tokyo (JP)

(72) Inventors: Hodaka Rokubuichi, Tokyo (JP); Kuniyuki Sato, Tokyo (JP); Kiyofumi Kitai, Tokyo (JP); Yasuyuki Sanda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 239 days.

(21) Appl. No.: 16/623,402

(22) PCT Filed: Jan. 23, 2018

(86) PCT No.: PCT/JP2018/001939
§ 371 (c)(1),
(2) Date: Dec. 17, 2019

(87) PCT Pub. No.: WO2019/021507
PCT Pub. Date: Jan. 31, 2019

(65) Prior Publication Data
US 2020/0176361 A1    Jun. 4, 2020

(30) Foreign Application Priority Data

Jul. 28, 2017 (JP) .............................. JP2017-146182

(51) Int. Cl.
*H01L 23/495* (2006.01)
*H01L 21/56* (2006.01)
*H01L 23/31* (2006.01)

(52) U.S. Cl.
CPC ........ *H01L 23/4952* (2013.01); *H01L 21/565* (2013.01); *H01L 23/3121* (2013.01); *H01L 23/49575* (2013.01)

(58) Field of Classification Search
CPC ........... H01L 23/4952; H01L 23/49575; H01L 21/565; H01L 23/3121; H01L 23/49551;
(Continued)

(56) References Cited

U.S. PATENT DOCUMENTS 9,241,375 B2 *  1/2016  Inoguchi ................ H05B 31/50
9,859,195 B1 *  1/2018  Shimizu ............ H01L 23/49582
(Continued)

FOREIGN PATENT DOCUMENTS

EP       1073116 A2 * 12/2001    ....... H01L 23/49503
JP       11-017071 A    1/1999
JP       2015-076488 A  4/2015

OTHER PUBLICATIONS

International Search Report and Written Opinion dated Apr. 3, 2018 for PCT/JP2018/001939 filed on Jan. 23, 2018, 7 pages including English Translation of the International Search Report.

*Primary Examiner* — Alexander O Williams
(74) *Attorney, Agent, or Firm* — Xsensus LLP

(57) ABSTRACT

A semiconductor device and a semiconductor module which can be reduced in size while ensuing insulation are provided. In the semiconductor device, a lead frame on which a circuit pattern is formed is provided on an insulation substrate; the circuit pattern of the lead frame is joined to the back-side electrode of a semiconductor chip via a solder layer, and the lead frame is electrically connected with the top-side electrode of the semiconductor chip via a wire; the lead frame 1 includes a terminal inside a mold-sealing resin and a terminal exposed to a space outside the mold-sealing resin, and the terminal is connected to a terminal block via a solder layer; and the lead frame, the insulation substrate, the
(Continued)

semiconductor chip and the terminal block are integrally molded and sealed by the mold-sealing resin.

9 Claims, 12 Drawing Sheets

(58) Field of Classification Search
CPC . H01L 25/18; H01L 23/49558; H01L 23/057; H01L 23/24; H01L 2224/48091; H01L 2224/73265; H01L 23/293; H01L 2924/00014
USPC .......................................................... 257/675
See application file for complete search history.

(56) References Cited

U.S. PATENT DOCUMENTS

| | | | |
|---|---|---|---|
| 2010/0133667 A1* | 6/2010 | Oka | H01L 25/16 257/666 |
| 2014/0299982 A1* | 10/2014 | Minamio | H01L 25/162 257/712 |
| 2015/0035132 A1* | 2/2015 | Tanaka | H01L 23/49575 257/692 |
| 2015/0279752 A1* | 10/2015 | Yokoyama | H01L 23/057 257/676 |
| 2017/0263527 A1* | 9/2017 | Mohn | H01L 23/3675 |
| 2018/0047649 A1* | 2/2018 | Bando | H01L 25/18 |
| 2018/0122720 A1* | 5/2018 | Hable | H01L 24/48 |
| 2020/0058600 A1* | 2/2020 | Murakami | H01L 23/04 |
| 2020/0066609 A1* | 2/2020 | Mohn | H01L 23/473 |
| 2021/0050286 A1* | 2/2021 | Maruyama | H01L 24/40 |
| 2021/0199469 A1* | 7/2021 | Ito | G01D 11/245 |

* cited by examiner

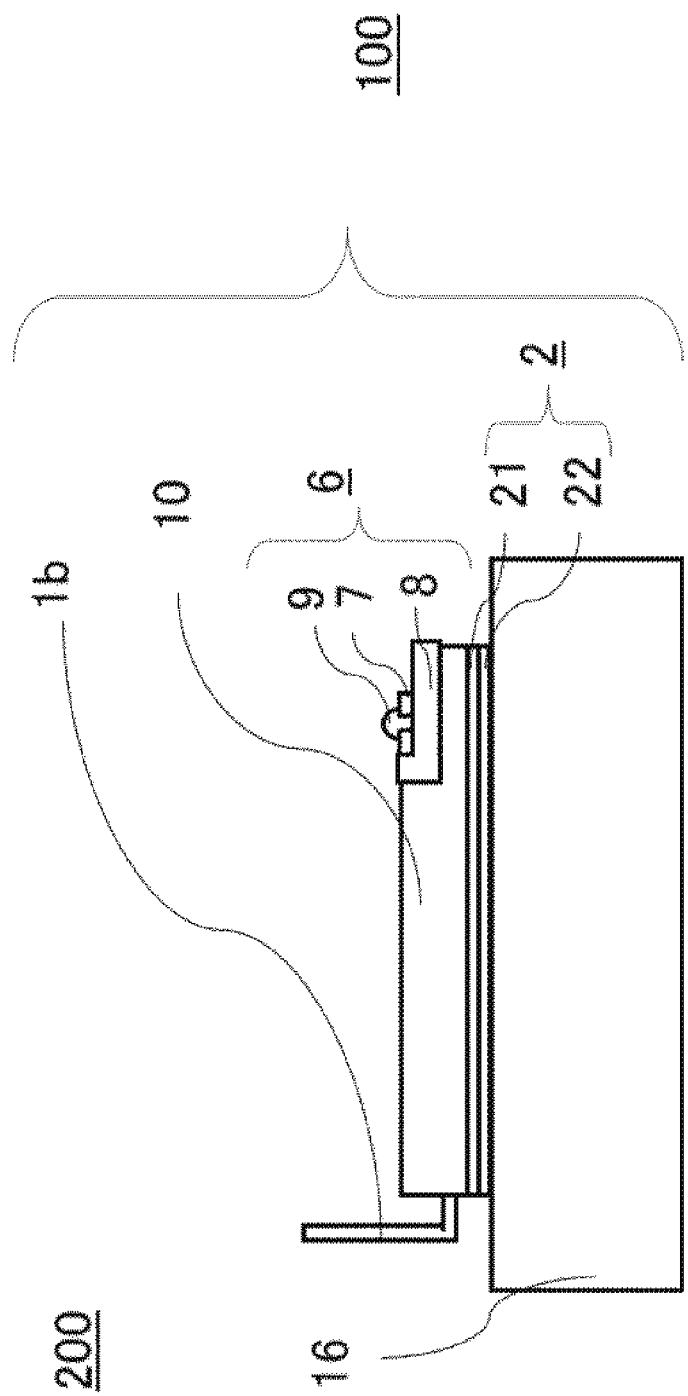

SEMICONDUCTOR DEVICE AND SEMICONDUCTOR MODULE WITH A HIGHEST PORTION OF A TERMINAL LOWER THAN A HIGHEST PORTION OF THE MOLD SEALING RESIN

CROSS-REFERENCE TO RELATED APPLICATIONS

The present application is based on PCT filing PCT/JP2018/001939, filed Jan. 23, 2018, which claims priority to JP 2017-146182, filed Jul. 28, 2017, the entire contents of each are incorporated herein by reference.

TECHNICAL FIELD

The present invention relates to a semiconductor device and a semiconductor module with a mold-sealing resign being formed.

BACKGROUND ART

Generally, a semiconductor device is molded and sealed with resin to protect a semiconductor chip and insulate a circuit pattern. So far, a mold-type semiconductor device has been known in which a semiconductor chip and a circuit pattern are integrally molded and sealed with mold-sealing resin using a mold. When compared with a case-type semiconductor device which has a case filled with resin to protect a semiconductor chip, the mold-type semiconductor device has advantages in productivity and size reduction. However, when a semiconductor chip is molded in a case of a mold-type semiconductor device, terminals of its lead frame and the like forming a circuit pattern are sandwiched by a mold. Therefore, the mold-type semiconductor device has a structure in which their terminals protrude horizontally from the side faces of a mold-sealing resin. This structure has a problem in that creeping discharges occur between the terminals and a heat dissipation plate attached to the outside of the semiconductor device. To solve this problem, methods for the terminals to be extended through the top face of the mold-sealing resin have been studied. Patent Document 1 discloses a technique in which the insulation between the terminals and the heat dissipation plate is ensured by connecting, in the mold-sealing resin, the terminals to a circuit board that is disposed opposite the face on which the semiconductor chip is mounted.

PRIOR ART DOCUMENTS

Patent Documents

Patent Document 1

Unexamined Patent Application Publication JP, 2015-76488, A

SUMMARY OF THE INVENTION

Problems to be Solved by the Invention

However, in a case where the top face of a mold-sealing resin is provided with a plurality of terminals carrying a large current, the plurality of terminals should be prevented from being arranged closely in order to ensure the insulation therebetween. This causes a problem in that the semiconductor device gets bigger in size.

The present invention is devised to solve the problem mentioned above, and aims to provide a mold-type semiconductor device reduced in size with the insulation between terminals being ensured.

Solution to Problems

A semiconductor device according to the present invention includes: an insulation substrate; a lead frame that is mounted on the insulation substrate; a semiconductor chip that is mounted on the lead frame; a mold-sealing resin that integrally molds and seals the insulation substrate, the lead frame and the semiconductor chip; a terminal part whose one end is joined to the lead frame inside the mold-sealing resin and whose another end is exposed to a space outside the mold-sealing resin so as to be connected to an external wire; and a terminal block including a base that is partially in contact with the mold-sealing resin and supports the terminal part.

Advantages of the Invention

According to the present invention, the terminal block joined to a lead frame and a semiconductor chip are integrally molded and sealed with mold-sealing resin, whereby it is possible to reduce the size of the semiconductor device while ensuring the insulation between the terminals.

BRIEF DESCRIPTION OF THE DRAWINGS

FIG. 12 is a sectional view showing a schematic structure of a semiconductor module according to Embodiment 7 of the present invention.

EMBODIMENTS

Embodiment 1

Figure 1:
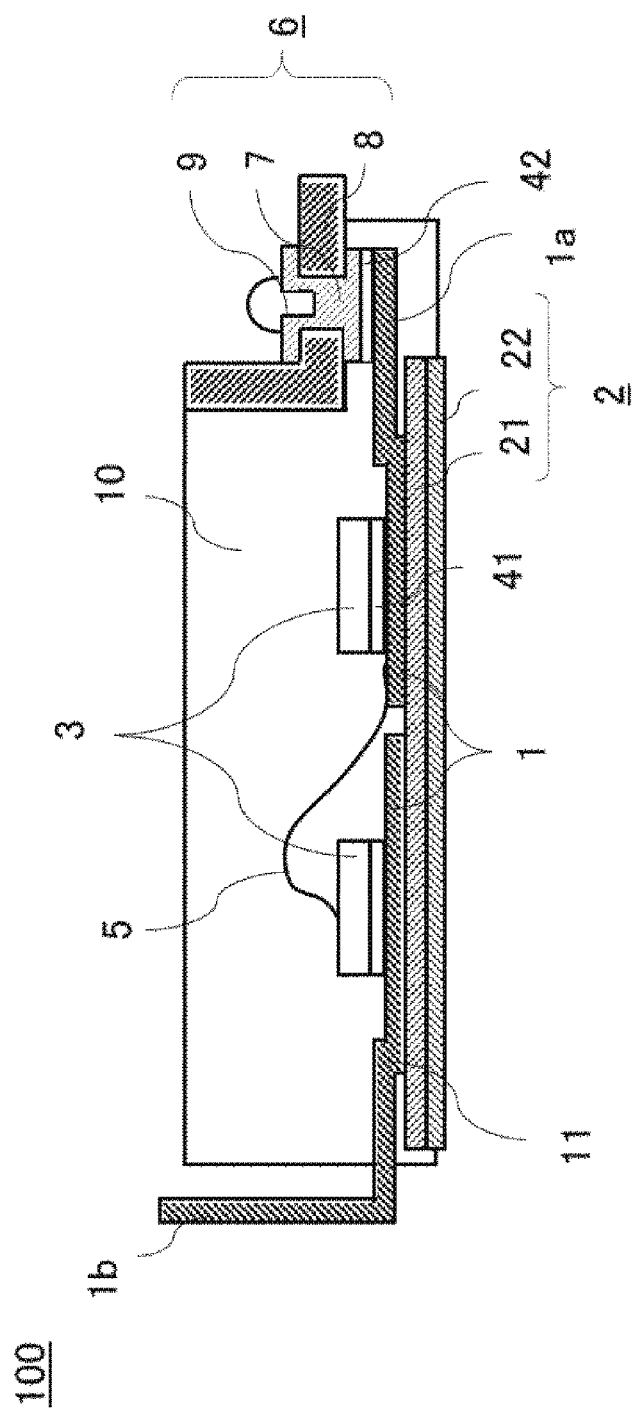
FIG. 1 is a sectional view showing a schematic structure of a semiconductor device according to Embodiment 1 of the present invention.

A semiconductor device according to Embodiment 1 of the present invention will be described with reference to FIG. 1 to FIG. 5. FIG. 1 is a sectional view of the semiconductor device according to Embodiment 1 of the present invention. As shown in FIG. 1, a semiconductor device 100 includes a lead frame 1, an insulation substrate 2, semiconductor chips 3, a terminal block 6, and a mold-sealing resin 10.

On the insulation substrate 2, the lead frame 1 with a circuit pattern formed thereon is mounted. A back-side electrode of a semiconductor chip 3 is joined to the circuit pattern of the lead frame 1 via a solder layer 41. A top-side electrode of the semiconductor chip 3 is electrically connected to the lead frame 1 via a wire 5. The lead frame 1 includes a terminal 1a inside the mold-sealing resin 10 and a terminal 1b exposed to a space outside the mold-sealing resin 10. To the terminal 1a, the terminal block 6 is connected via a solder layer 42. The mold-sealing resin 10 is formed so as to integrally mold and seal the lead frame 1, the insulation substrate 2, the semiconductor chips 3 and the terminal block 6.

Figure 2:
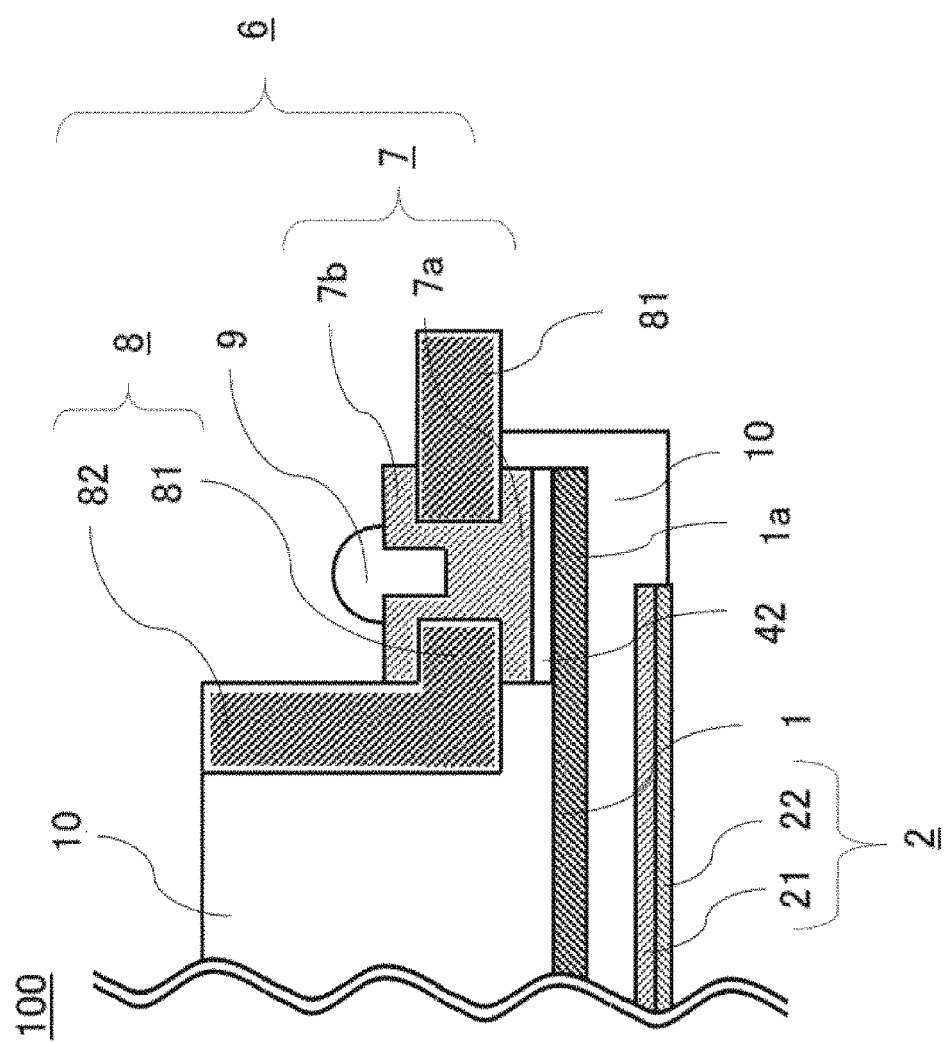
FIG. 2 is an enlarged sectional view showing a schematic structure of part of the semiconductor device according to Embodiment 1 of the present invention.

FIG. 2 is an enlarged sectional view showing part of the semiconductor device according to Embodiment 1 of the present invention. As shown in FIG. 2, the terminal block 6 includes a terminal part 7 which is conductive, and a base 8 which is insulative and supports the terminal part 7.

The terminal part 7 consists of two portions: the side of a primary terminal 7a connected to the lead frame 1, and the side of a secondary terminal 7b connected to an external wire; a crossover therebetween is fixed to the base 8. The side of the primary terminal 7a is inside the mold-sealing resin 10 and joined to the terminal 1a of the lead frame 1 via the solder layer 42. In the side of the secondary terminal 7b, a concave portion is formed for connecting external wire. The secondary terminal 7b is exposed to a space outside an upper face of the mold-sealing resin 10. A connecting part 9 such as a removable screw is inserted into the concave portion of the secondary terminal 7b so that the external wire will be fixed to and connected to the secondary terminal.

The base 8 includes: a horizontal part 81 into which the terminal part 7 is fitted, and a partition wall 82 rising up at one end of the horizontal part 81. One face of the horizontal part 81 of the base 8 that is nearer to the primary terminal 7a, is in contact with the mold-sealing resin 10. The back face thereof is exposed to a space outside the mold-sealing resin 10. A side face of the partition wall 82 is in contact with the mold-sealing resin 10, the side face being opposite to a side face to which the horizontal part 81 is provided. The top face of the partition wall 82 is exposed to a space outside the mold-sealing resin 10.

Figure 3:
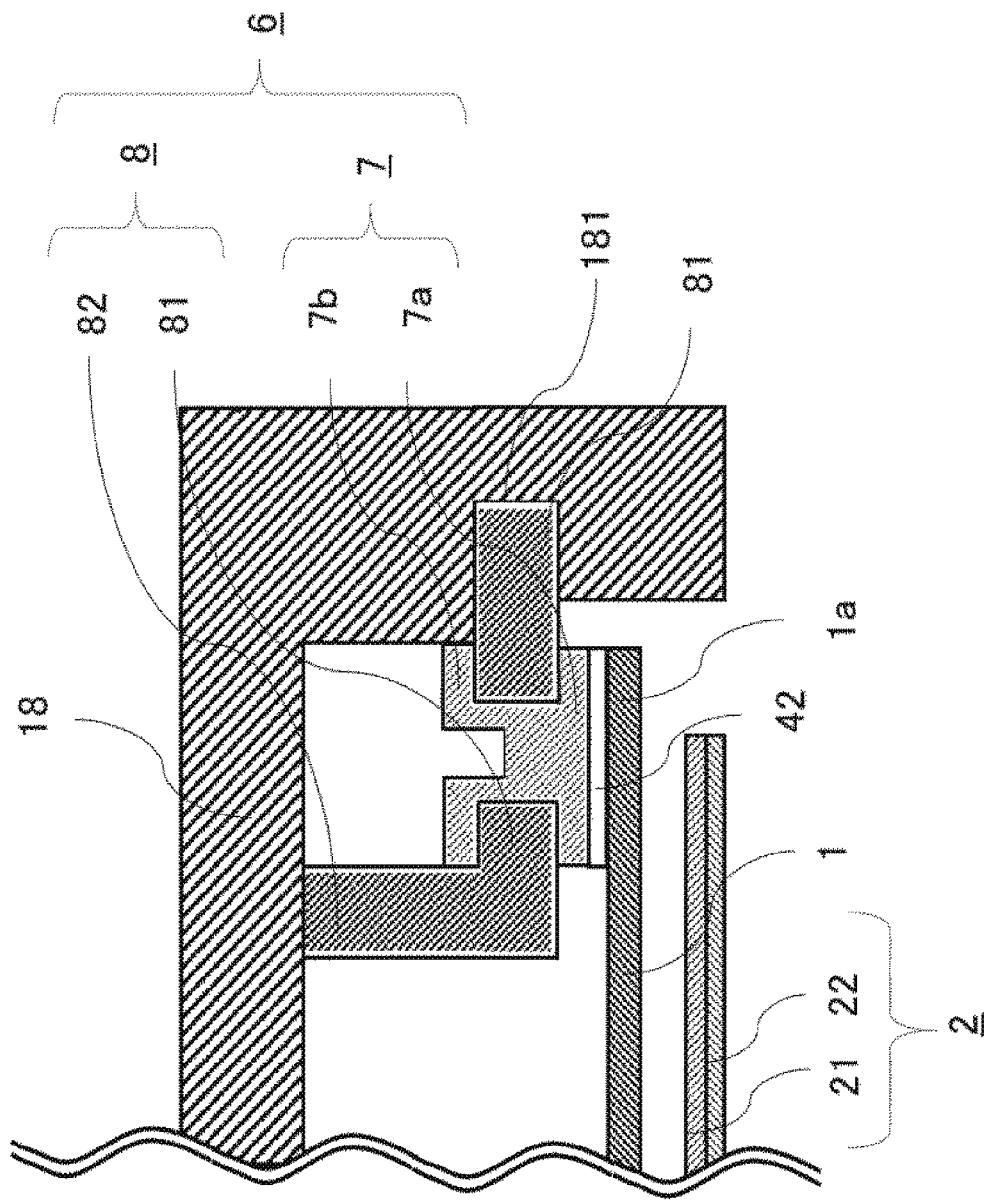
FIG. 3 is a sectional view showing a schematic structure of the semiconductor device according to Embodiment 1 of the present invention in a state in which a mold covers a terminal block thereof.

As shown in FIG. 3, the terminal block 6 including the above-described terminal part 7 and base 8 is sealed by using a mold 18. The terminal block 6 is disposed in the mold 18 with the terminal part 7 being joined to the terminal 1a of the lead frame 1. The terminal block 6 is supported with the outer end of the horizontal part 81 of the base 8 being inserted into an insertion groove 181 provided to the mold 18. At this moment, the top face of the partition wall 82 of the base 8 is in close contact with the mold 18. By disposing the terminal block 6 in the mold 18 in a way described above, the mold-sealing resin 10 can be prevented from leaking out toward the secondary terminal 7b of the terminal part 7 even under a high molding pressure.

Figure 4:
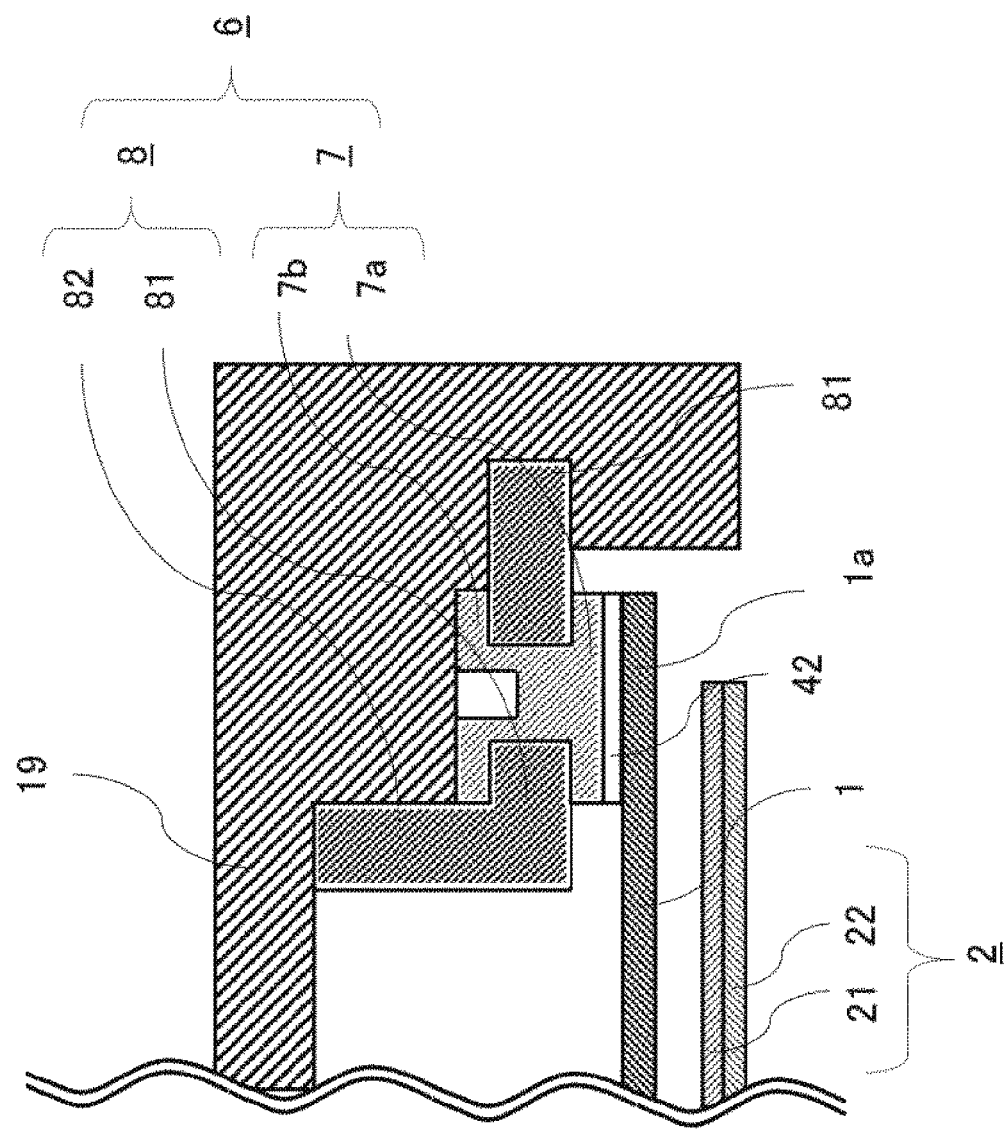
FIG. 4 is a sectional view showing a schematic structure of the semiconductor device according to Embodiment 1 of the present invention in a state in which another mold is fitted into the terminal block thereof.

As shown in FIG. 4, another way is to use a mold 19 and dispose the terminal block 6 so that the top face of the partition wall 82, the partition wall's side face opposite to its side face whose facing space is filled with the mold-sealing resin 10, and the top face of the horizontal part 81 are in tight contact with the mold 19. By disposing the terminal block 6 in the mold 19 in the way described above, the mold-sealing resin 10 can be prevented from leaking out toward the secondary terminal 7b of the terminal part 7.

Figure 5:
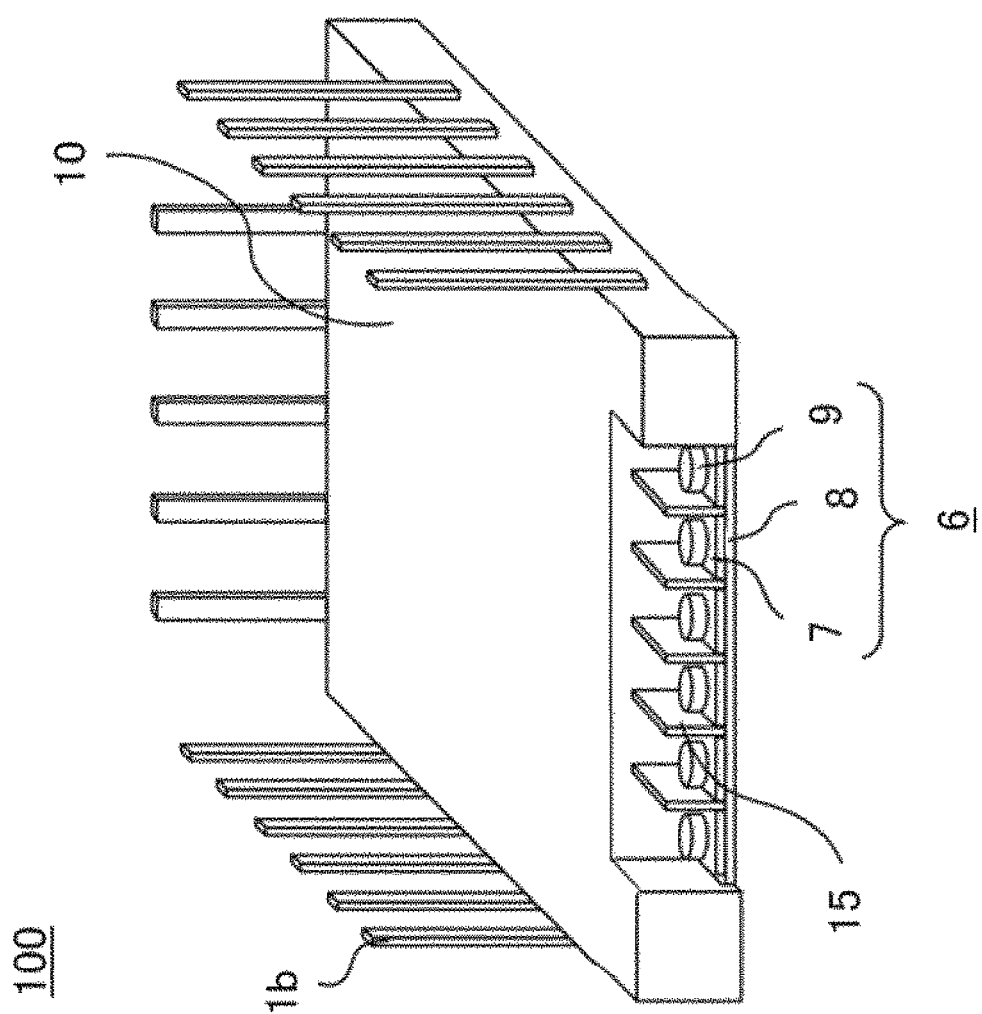
FIG. 5 is a perspective view showing a schematic structure of the semiconductor device according to Embodiment 1 of the present invention.

FIG. 5 is a perspective view showing a semiconductor device in which the terminal block 6 and the semiconductor chips 3 are integrally molded and sealed with the mold-sealing resin 10. As shown in FIG. 5, the terminal block 6 is provided to one side of the mold-sealing resin 10 formed into a flat and substantially rectangular shape. In the terminal block 6, a plurality of terminal parts 7 to be connected to external wires are adjacently arranged. FIG. 5 exemplifies a case in which the semiconductor device 100 includes an inverter circuit for three-phase power, and connects a power supply and a load device which are not illustrated. On the terminal block 6, six terminal parts 7 are arranged for the power supply side and the load device side.

The plurality of terminal parts 7 are separated from each other by insulative partition plates 15 provided to the terminal block 6. The partition plates 15 are provided so as to be higher than a plane where the connecting parts 9 are fastened to the terminal parts 7. This structure can prevent the external wires connected to the terminal parts 7 from being in contact to each other even in a case in which the plurality of terminal parts 7 are adjacently arranged in a row on the terminal block 6.

As described above, in the semiconductor device 100, the terminal block 6 includes the terminal parts 7 to be connected to external wires and the insulative base 8 to support the terminal parts 7, wherein the lead frame 1, the insulation substrate 2, and the semiconductor chips 3 are integrally molded and sealed by the mold-sealing resin 10. Because the plurality of terminal parts 7 are arranged with intervals therebetween by the use of insulative base 8, it is possible to extend the plurality of terminals out of the mold-sealing resin 10 side by side with the insulation therebetween ensured, which leads to a size reduction of the semiconductor device 100.

The insulation substrate 2 is an insulation sheet in which an insulation layer 21 and a metal foil 22 are layered. The side of the insulation layer 21 of the insulation substrate 2 is provided with the lead frame 1, and the side of the metal foil 22 is exposed to a space outside the mold-sealing resin 10. The insulation layer 21 of the insulation substrate 2 is formed of an insulation material with a high thermal conductivity such as a filler-containing epoxy resin. For the metal foil 22, a foil such as a copper foil or an aluminum foil can be used.

For the semiconductor chip 3, for example, a diode for a converter unit to convert AC power into DC power, a bipolar transistor for an inverter unit to convert DC power into AC power, an insulated gate bipolar transistor (IGBT), a metal oxide semiconductor field effect transistor (MOSFET), or a gate turn-off thyristor (GTO) can be used.

On the lead frame 1, a circuit pattern is formed, for example, by performing press working of a copper plate of 0.6 mm thickness. The circuit pattern of the lead frame 1 has steps 11 formed in order to ensure insulation at the ends of the insulation substrate 2. The steps 11 are provided so as to be positioned inside the ends of the insulation substrate 2.

The steps 11 of the lead frame 1 are formed, for example, by half blanking. The height of the steps 11 of the lead frame 1 is, for example, in a rage between 0.1 mm and less than 0.3 mm being a thickness thinner than a half of the thickness of the lead frame. The steps' height higher than 0.1 mm can suppress voids from occurring in a part of the mold-sealing resin 10 that fills up a gap between the insulation substrate 2 and the lead frame 1. The steps' height lower than 0.3 mm being a half of the thickness of the lead frame 1 can ensure the strength.

For the wires 5, an aluminum wire, a copper wire or the like can be used. For the bonding material to join the lead frame 1 and the semiconductor chip 3 and to join between the lead frame 1 and the terminal block 6, the solder layers 41 and 42 were exemplified. Instead of solder, it is possible to use, for example, silver paste.

The mold-sealing resin 10 not only ensures the insulation between the sealed components, but also serves as a case of the semiconductor device 100. For forming the mold-sealing resin 10, it is possible to use transfer molding, injection molding, compression molding or the like. For the material of the mold-sealing resin 10, it is possible to use a filler-containing epoxy resin, a phenolic resin or the like.

For the terminal parts 7, it is possible to use a metal with high conductivity such as copper. It is more preferable that the surfaces of the terminal parts 7 are plated with nickel or the like.

The base 8 is formed of a highly insulative material, and for the material it is possible to use polyester resin, polystyrene, polyvinyl acetate, acrylic resin, ABS resin, polymethyl methacrylate, polyvinyl alcohol, linear-chain polyester such as polyethylene terephthalate or polybutylene terephthalate, polyphenylene oxide, polyamide, polycarbonate, polyphenylene sulfide, polyurethane, phenolic resin, urea resin, melamine resin, epoxy resin, polyester resin, or the like.

In order that the base 8 is attached closely to the mold-sealing resin 10, surface processing such as plasma irradiation or UV irradiation is performed for the base 8 before forming. In order to obtain a physical anchor effect, it is preferable to perform surface blasting operations.

Embodiment 2

Figure 6:
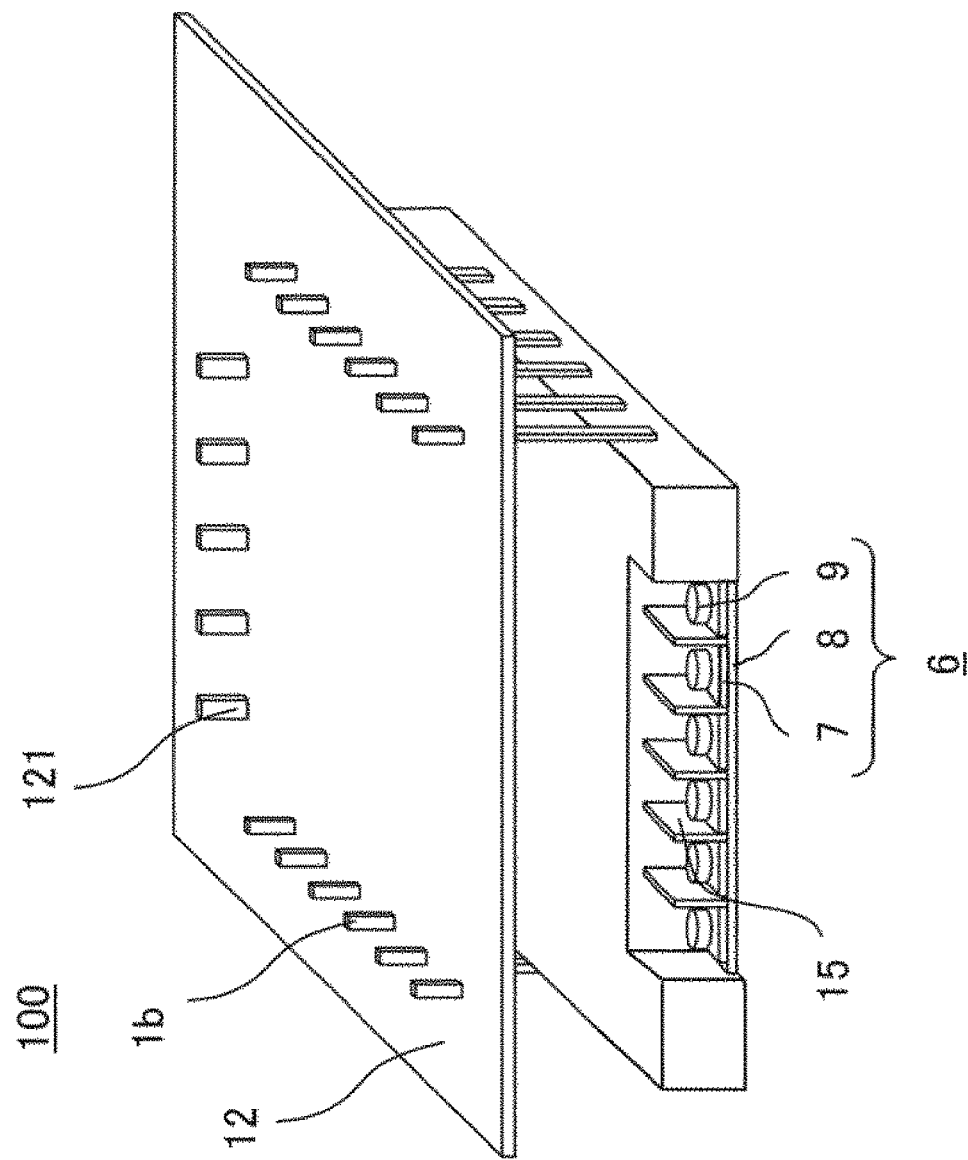
FIG. 6 is a perspective view showing a schematic structure of a semiconductor device according to Embodiment 2 of the present invention in a state in which a control circuit board is mounted thereto.

A semiconductor device according to Embodiment 2 of the present invention will be described with reference to FIG. 6. FIG. 6 is a perspective view showing a schematic structure of the semiconductor device according to Embodiment 2 of the present invention. In FIG. 6, the same symbols as used in FIG. 1 are the same or equivalent parts as those shown therein. The semiconductor device 100 according to the present embodiment differs from that according to Embodiment 1 in that a control circuit board 12 is further provided, and the other components are the same.

In the present embodiment, the control circuit board 12 is provided, as shown in FIG. 6, so as to be opposite to the face on which the semiconductor chips 3 are mounted. On the control circuit board 12, a control circuit to control the operations of the semiconductor chips 3 is disposed.

Along one side of the mold-sealing resin 10 which is formed in a flat and substantially rectangular shape, there provided is the terminal block 6 connected to the terminals 1a of the lead frame 1; along the other sides thereof, there provided are the terminals 1b of the lead frame 1, which are extended from side faces of the mold-sealing resin 10 and are bent. The terminals 1b of the lead frame 1 are inserted into through holes 121 of the control circuit board 12 and joined to the board with solder or the like.

Also in this structure, similarly to Embodiment 1, the terminal block 6 and the semiconductor chip 3 are integrally molded and sealed, whereby it is possible to reduce the size of the semiconductor device 100 while ensuring the insulation between the terminals. In the present embodiment, the control circuit board 12 is further provided so as to be opposite to the face on which the semiconductor chips 3 are mounted, so that the control circuit can be disposed away from the main circuit in which a large current flows. This makes it easy to route the circuits, reducing the size of the semiconductor device 100.

Embodiment 3

Figure 7:
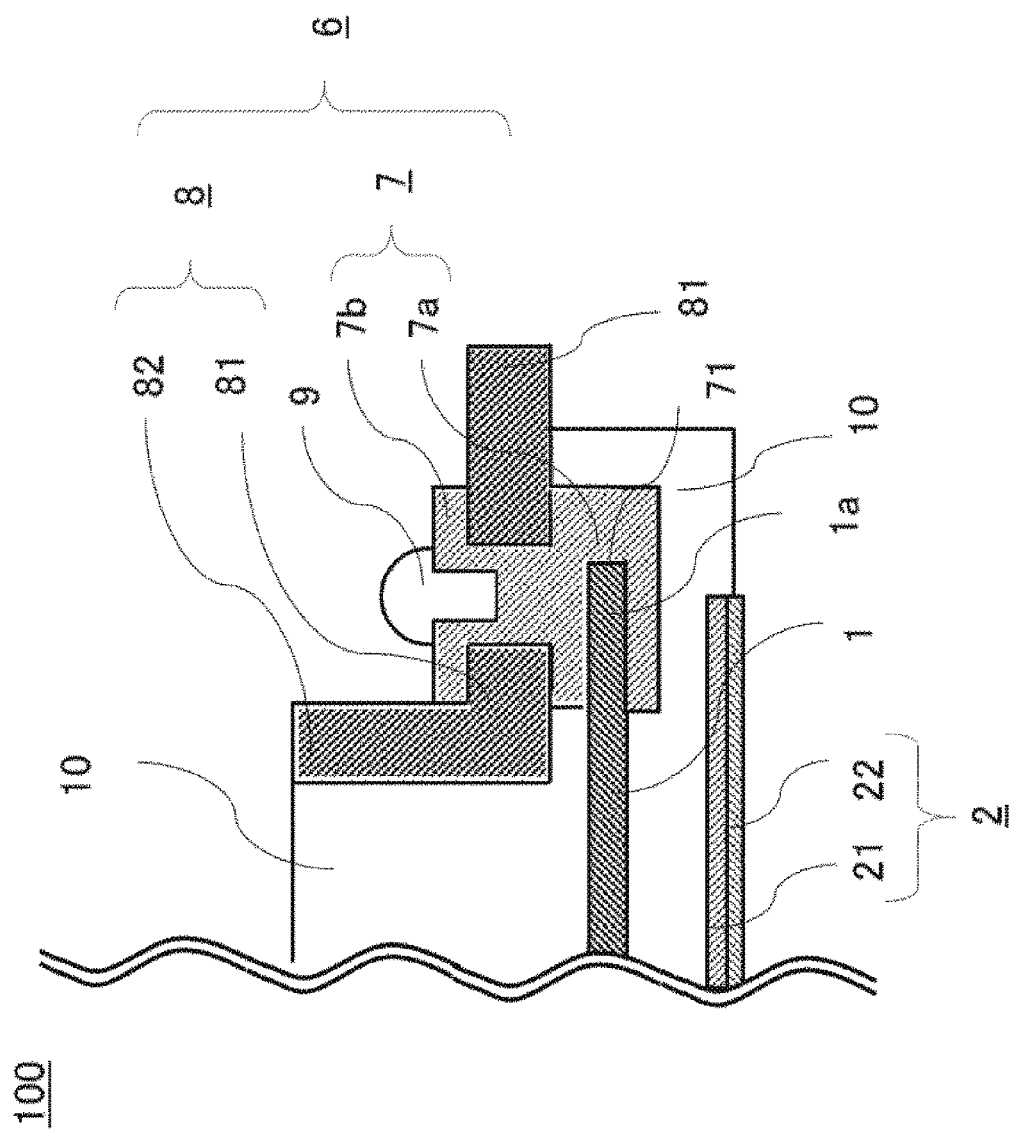
FIG. 7 is an enlarged sectional view showing a schematic structure of part of a semiconductor device according to Embodiment 3 of the present invention.

A semiconductor device according to Embodiment 3 of the present invention will be described with reference to FIG. 7. FIG. 7 is an enlarged sectional view showing a schematic structure of part of the semiconductor device according to Embodiment 3 of the present invention. In FIG. 7, the same symbols as used in FIG. 1 are the same or equivalent parts as those shown therein. In the semiconductor device 100 according to the present embodiment, the terminal parts 7 of the terminal block 6 have a structure different from that in Embodiment 1, and the other components are the same.

As shown in FIG. 7, in the present embodiment, an insertion slit 71 is formed on the side of the primary terminal 7a of the terminal part 7, so that the terminal 1a of the lead frame 1 is inserted into the insertion slit 71. The insertion slit 71 is properly designed in accordance with the dimensions of the lead frame 1, and the lead frame 1 and the terminal part 7 are electrically connected by pressure welding.

Also in this structure, similarly to Embodiment 1, the terminal block 6 and the semiconductor chip 3 are integrally molded and sealed, whereby it is possible to reduce the size of the semiconductor device 100 while ensuring the insulation between the terminals. In the present embodiment, the terminal 1a of the lead frame 1 is inserted into the insertion slit 71 formed in the terminal part 7, and then, they are connected to each other by pressure welding. This does not require an joining operation using different kinds of metal such as solder, so that the assembly will be easier, enhancing the productivity. Also, by covering the insertion slit 71 with material of the mold-sealing resin 10, the strength against the external vibration can be ensured.

Embodiment 4

Figure 8:
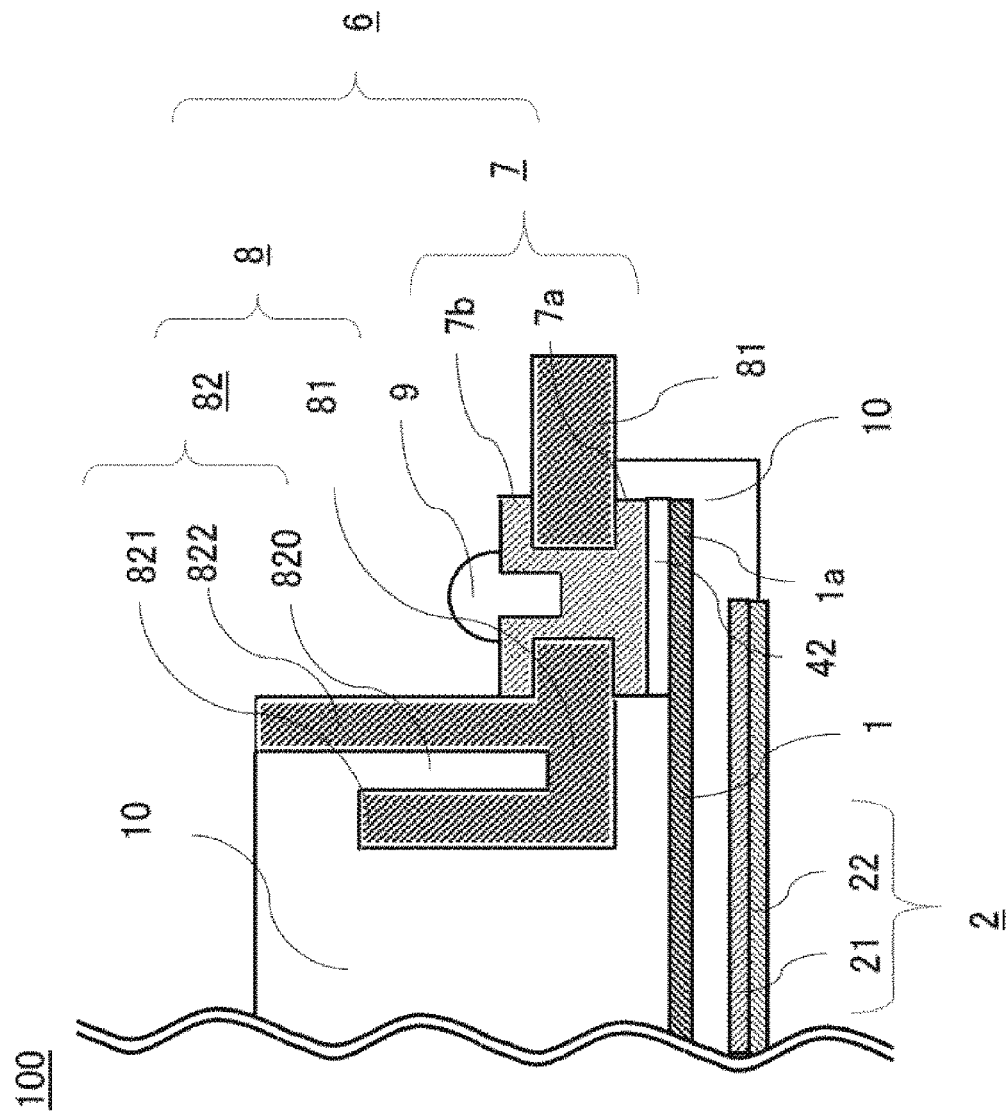
FIG. 8 is an enlarged sectional view showing a schematic structure of part of a semiconductor device according to Embodiment 4 of the present invention.

A semiconductor device according to Embodiment 4 of the present invention will be described with reference to FIG. 8. FIG. 8 is an enlarged sectional view showing a schematic structure of part of the semiconductor device according to Embodiment 4 of the present invention. In FIG. 8, the same symbols as used in FIG. 1 are the same or equivalent parts as those shown therein. In the semiconductor device 100 according to the present embodiment, the base 8 of the terminal block 6 has a structure different from that in Embodiment 1, and the other components are the same.

As shown in FIG. 8, in the present embodiment, the partition wall 82 of the base 8 includes two separate parts, namely an inner partition wall 821 near to the mold-sealing resin 10 and an outer partition wall 822. Between the inner partition wall 821 and the outer partition wall 822, a groove 820 is formed. The inner partition wall 821 is formed so that the top face thereof is located at a position lower than that of the outer partition wall 822. When the mold-sealing resin 10 is molded, the mold is set so as to touch the top face of the outer partition wall 822, whereby the resin can be prevented from leaking toward the secondary terminal 7b of the terminal block 6, to fill the groove 820.

Also in this structure, similarly to Embodiment 1, the terminal block 6 and the semiconductor chip 3 are integrally molded and sealed, whereby it is possible to reduce the size of the semiconductor device 100 while ensuring the insulation between the terminals. Furthermore, in the present embodiment, the partition wall 82 is provided with the groove 820, whereby the contact area between the mold-sealing resin 10 and the partition wall 82 is increased, preventing the mold-sealing resin 10 from separating from the partition wall 82. In other words, the adhesiveness between the mold-sealing resin 10 and the terminal block 6 can be improved.

Embodiment 5

Figure 9:
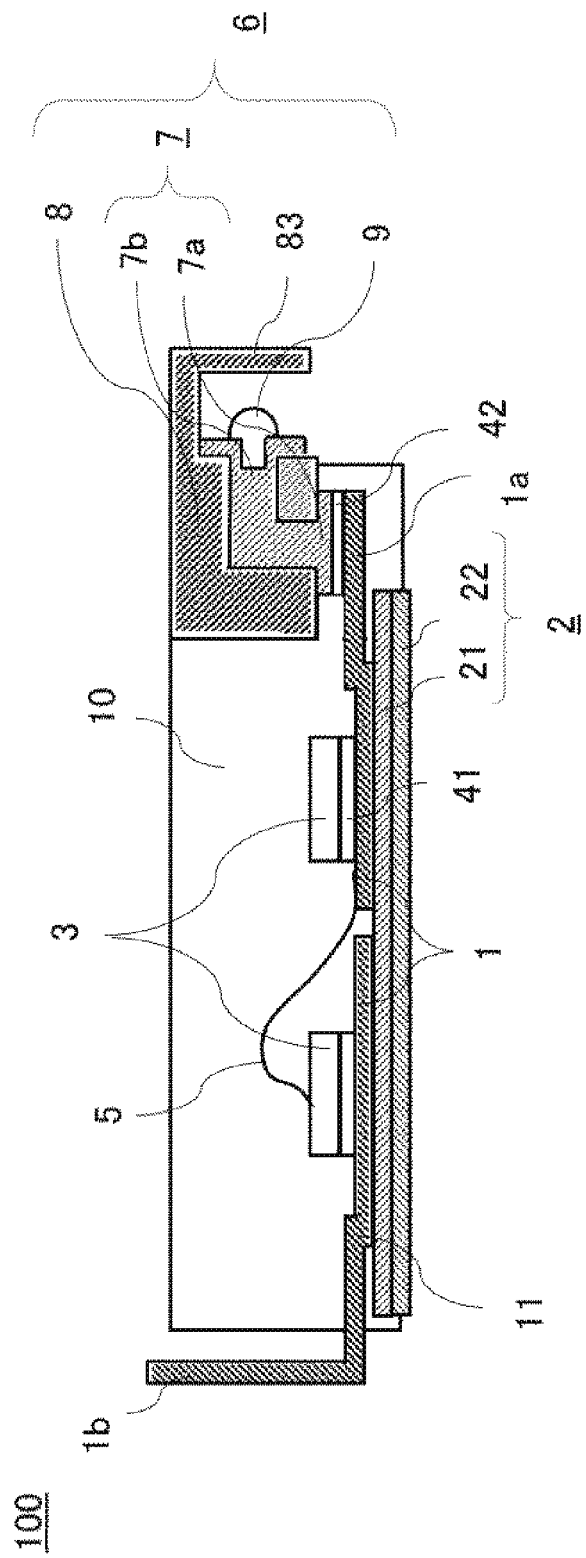
FIG. 9 is a sectional view showing a schematic structure of a semiconductor device according to Embodiment 5 of the present invention.

A semiconductor device according to Embodiment 5 of the present invention will be described with reference to FIG. 9. FIG. 9 is a sectional view showing a schematic structure of the semiconductor device according to Embodiment 5 of the present invention. In FIG. 9, the same symbols as used in FIG. 1 are the same or equivalent parts as those shown therein. In the semiconductor device 100 according to the present embodiment, the terminal block 6 has a structure different from that in Embodiment 1, and the other components are the same.

As shown in FIG. 9, in the present embodiment, the terminal part 7 has a structure in which the side of the secondary terminal 7b is disposed at a right angle to the side of the primary terminal 7a. In this structure, the secondary terminal 7b to which the connecting part 9 is fastened is exposed to a space outside a side face of the mold-sealing resin 10. Also, the base 8 includes a protrusion 83 that protrudes over the secondary terminal 7b, to protect the terminal from short circuiting or the like.

Also in this structure, similarly to Embodiment 1, the terminal block 6 and the semiconductor chip 3 are integrally molded and sealed, whereby it is possible to reduce the size of the semiconductor device 100 while ensuring the insulation between the terminals. In a case where the semiconductor device 100 is disposed so that the mold-sealing resin 10's side face close to the terminal block 6 comes to an upper position, the secondary terminals 7b to which the connecting parts 9 are fastened are located at a top position. This makes it easier to connect external wires to the device, improving working efficiency. Note that the protrusion 83 provided to the base 8 is unnecessary if the insulation of the secondary terminals 7b is ensured.

Embodiment 6

Figure 10:
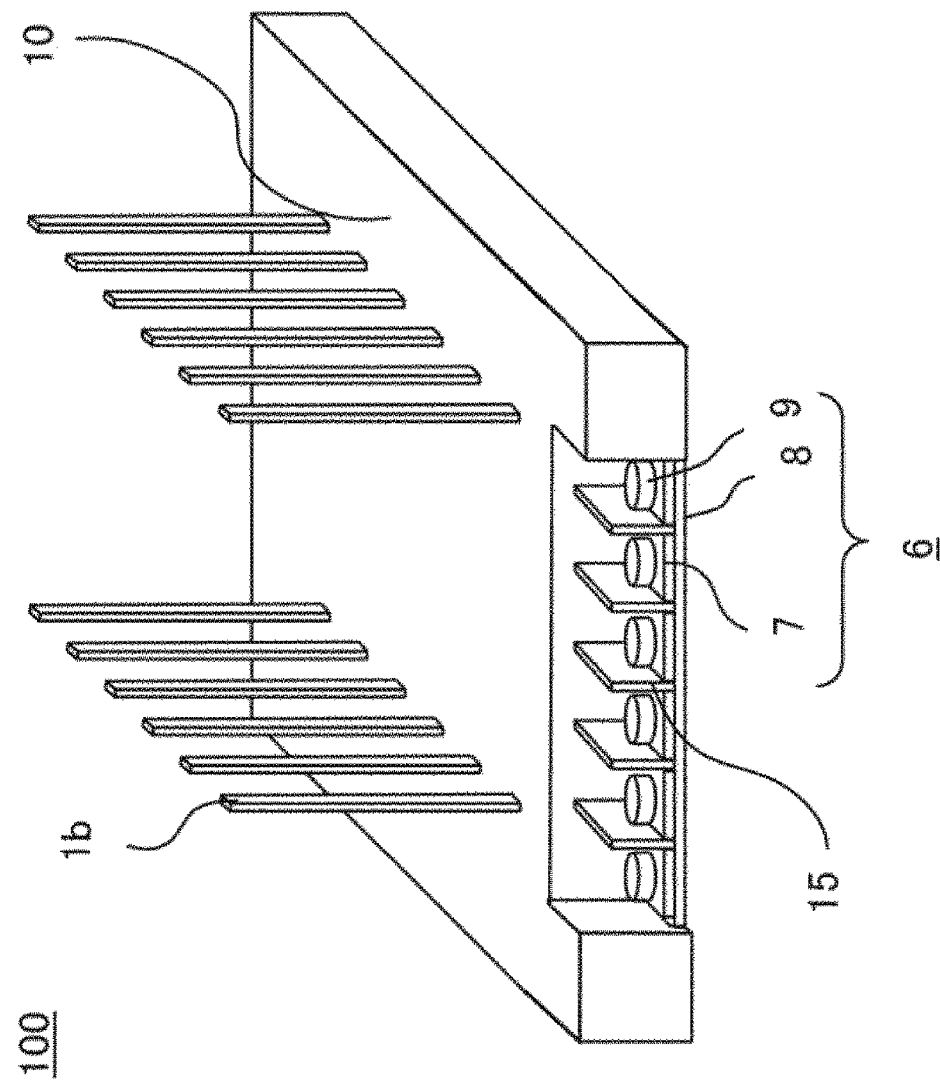
FIG. 10 is a perspective view showing a schematic structure of a semiconductor device according to Embodiment 6 of the present invention.
Figure 11:
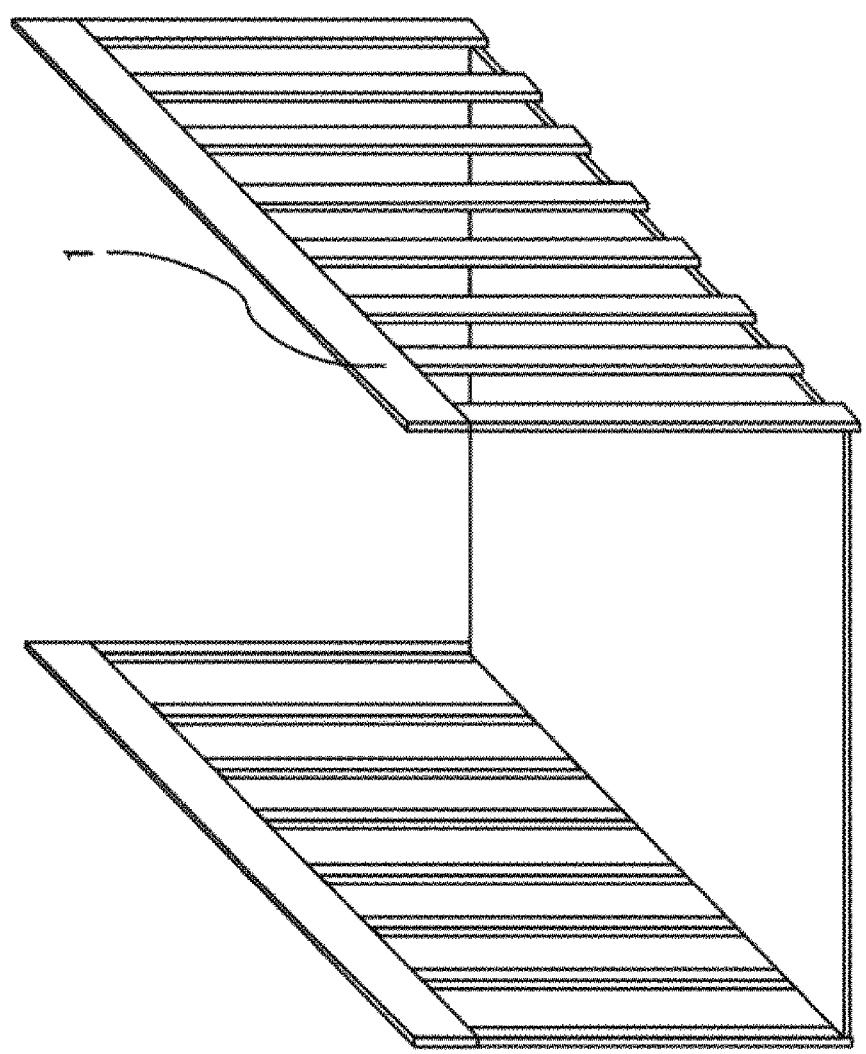
FIG. 11 is a perspective view showing one of the steps in which the semiconductor device according to Embodiment 6 of the present invention is manufactured.

A semiconductor device according to Embodiment 6 of the present invention will be described with reference to FIG. 10 and FIG. 11. FIG. 10 is a perspective view showing the semiconductor device according to Embodiment 6. FIG. 11 is a perspective view showing one of the steps in which the semiconductor device according to Embodiment 6 of the present invention is manufactured. In FIG. 10 and FIG. 11, the same symbols as used in FIG. 1 are the same or equivalent parts as those shown therein. In Embodiment 1, in order to extend, from the mold-sealing resin 10, the lead frame 1 to which the terminals 1b are formed, the terminals 1b are bent and extended from a side face of the mold-sealing resin 10; the present embodiment differs in that the terminals 1b are extended from the top face of the mold-sealing resin 10.

As shown in FIG. 10, in the present embodiment, the terminal block 6 connected to the terminals 1a of the lead frame is provided to one side of the mold-sealing resin 10; the terminals 1b of the lead frame 1 provided along other sides of the mold-sealing resin extend out from the top face of the mold-sealing resin 10. Here, the circuit pattern is formed so that the terminals 1a of the lead frame 1 are the main terminals connected to the main circuit of high voltage and the terminals 1b thereof are the control terminals connected to the control circuit of low voltage.

FIG. 11 shows a step for manufacturing the semiconductor device provided with a lead frame 1 shown in FIG. 10. As shown in FIG. 11, the lead frame 1 is bent into a squared U-shape before being sealed with resin. In this state, the semiconductor chips 3 and the terminal block 6 are joined to the lead frame 1. Then, the mold-sealing resin 10 is formed by using the mold. And then, portions of the lead frame 1 sticking out from the top face of the mold-sealing resin 10 are cut to form the terminals 1b of the lead frame 1.

Also in this structure, similarly to Embodiment 1, the terminal block 6 and the semiconductor chip 3 are integrally molded and sealed, whereby it is possible to reduce the size of the semiconductor device 100 while ensuring the insulation between the terminals. Furthermore, in the present embodiment, the terminals 1b of the lead frame 1 which are not joined to the terminal block 6 are assigned to the terminals for the control circuit, and the terminals 1b are adjacently arranged in lines on the top face of the mold-sealing resin 10. This makes it possible to reduce the size of the semiconductor device when compared with the case in which the terminals 1b extend out from the sides of the mold-sealing resin 10. The terminals 1b of the lead frame 1 may be connected to the control circuit board 12 provided opposite the face on which the semiconductor chips 3 are mounted.

Embodiment 7

A semiconductor device according to Embodiment 7 of the present invention will be described with reference to FIG. 12. FIG. 12 is a sectional view showing the semiconductor module according to Embodiment 7. In FIG. 12, the same symbols as used in FIG. 1 are the same or equivalent parts as those shown therein. In the present embodiment, a heatsink 16 is further provided to the semiconductor device 100 according to Embodiment 1, to be referred as a semiconductor module 200.

In the present embodiment, as shown in FIG. 12, the semiconductor module 200 has a structure in which the heatsink 16 is attached, through silicone grease (not illustrated), onto the metal foil 22 of the insulation substrate 2 of the semiconductor device 100.

The terminal block 6 joined to the terminals 1a of the lead frame 1 is provided to one side of the mold-sealing resin 10, while the terminals 1b of the lead frame 1 extend out from another side. The terminal block 6 is provided so that the secondary terminals 7b of the terminal part 7 are exposed to a space outside an upper portion of the mold-sealing resin 10. Here, the circuit is formed so that the terminals 1a serve as main terminals connected to the main circuit of high voltage and the terminals 1b serve as control terminals connected to the control circuit of low voltage.

Also in this structure, similarly to Embodiment 1, the terminal block 6 and the semiconductor chip 3 are integrally molded and sealed, whereby it is possible to reduce the size of the semiconductor device 100 while ensuring the insulation between the terminals. Furthermore, the terminal block 6 joined to the terminals 1a of the lead frame 1 connected to the main circuit has a structure in which the secondary terminals 7b of the terminal parts 7 are exposed to a space outside an upper portion of the mold-sealing resin 10. This causes the creeping discharge between the terminals and the heatsink 16 to less occur when compared with the case in which the main terminals of high voltage extend out from the side face of the mold-sealing resin 10. Therefore, there becomes no need to increase the distances between the terminals and the heatsink 16 for ensuring insulation, which leads to a reduction in the size of the semiconductor module 200.

Although the insulation sheet that has an insulation layer 21 with a metal foil 22 laminated thereon is shown for an example of the insulation substrate 2 in Embodiments 1 to 7, an insulation substrate which is a ceramic substrate having a circuit pattern formed thereon may be used as the insulation substrate 2. In this case, the terminals of the lead frame 1 and the circuit pattern of the insulation substrate are joined by ultrasonic bonding, laser irradiation or the like. Instead, they may be joined by reflow soldering processes or the like. By using an insulation substrate, the heat dissipation from the semiconductor device 100 can be improved. For the ceramic of the insulation substrate, silicon dioxide, aluminum nitride, silicon nitride, or the like can be used.

In Embodiments 1 to 7, the terminal block 6 is provided on one side of the mold-sealing resin 10. Instead, a plurality of the terminal blocks 6 may be provided: for example, the terminal blocks may be provided on two sides opposite to each other.

In Embodiments 1 to 7, the partition plates 15 are provided to the terminal block 6; however, all or a part of the partition plates is omitted if the insulation is ensured.

| Description of Symbols | | | |
|---|---|---|---|
| 100: semiconductor device, | 200: semiconductor module, | 1: lead frame, | |
| 1a, 1b: terminal, | 2: insulation substrate, | 21: insulation layer, | 22: metal foil, |
| 3: semiconductor chip, | 41, 42: solder layer, | 5: wire, | 6: terminal block, |
| 7: terminal part, | 7a: primary terminal, | 7b: secondary terminal, | |
| 8: base, | 81: horizontal part, | 82: partition wall, | |
| 9: connecting part, | 10: mold-sealing resin, | 11: step, | 12: control circuit board, |
| 15: partition plate, | 16: heatsink, | 18, 19: mold | |

The invention claimed is:

1. A semiconductor device comprising:
an insulation substrate;
a lead frame that is mounted on the insulation substrate;
a semiconductor chip that is mounted on the lead frame;
a mold-sealing resin that integrally molds and seals the insulation substrate, the lead frame and the semiconductor chip;
a terminal whose lower end, is joined to the lead frame inside the mold-sealing resin and whose upper end is exposed to a space outside the mold-sealing resin for connection to an external wire; and
a base that includes a first portion contacting with a lateral side of the mold-sealing resin and a second portion supporting the terminal,
wherein the terminal is conductive and the base is insulative, and
wherein a highest portion of the terminal is lower than a highest portion of the mold-sealing resin.

2. The semiconductor device according to claim 1, wherein the second portion is a horizontal part and the first portion is a partition wall rising up at an end of the horizontal part.

3. A semiconductor device comprising:
an insulation substrate;
a lead frame that is mounted on the insulation substrate:
a semiconductor chip that is mounted on the lead frame;
a mold-sealing resin that integrally molds and seals the insulation substrate, the lead frame and the semiconductor chip;
a terminal whose one end is joined to the lead frame inside the mold-sealing resin and whose another end is exposed to a space outside the mold-sealing resin for connection to an external wire; and
a base that is partially in contact with the mold-sealing resin and supports the terminal,
wherein the terminal has an insertion slit and the lead frame is inserted into the insertion slit for connection.

4. The semiconductor device according to claim 1, wherein the base has a groove formed therein and the groove is filled with the mold-sealing resin.

5. A semiconductor device comprising:
an insulation substrate:
a lead frame that is mounted on the insulation substrate:
a semiconductor chip that is mounted on the lead frame;
a mold-sealing resin that integrally molds and seals the insulation substrate, the lead frame and the semiconductor chip;
a terminal whose one end is joined to the lead frame inside the mold-sealing resin and whose another end is exposed to a space outside the mold-sealing resin for connection to an external wire;
a base that is partially in contact with the mold-sealing resin and supports the terminal; and
a terminal block including the base and a plurality of the terminals, at least one of the plurality of the terminals is separated by a partition plate.

6. The semiconductor device according to claim 1, wherein the lead frame protrudes from a top face of the mold-sealing resin.

7. The semiconductor device according to claim 1, wherein the upper end of the terminal for connection with the external wire is exposed to a space outside a side face of the mold-sealing resin.

8. The semiconductor device according to claim 1, wherein the lead frame extends out from the mold-sealing resin and is connected to a control circuit board which is opposite a face on which the semiconductor chip is mounted.

9. A semiconductor module comprising:
the semiconductor device according to claim 1; and a heatsink that is attached on a back side of a face on which the semiconductor chip of the semiconductor device is mounted.

* * * * *